(12) United States Patent
Lee et al.

(10) Patent No.: US 6,190,943 B1
(45) Date of Patent: Feb. 20, 2001

(54) CHIP SCALE PACKAGING METHOD

(75) Inventors: Cheng-Hui Lee, Taipei Hsien; Kuo-Teh Ho; Chong-Ren Maa, both of Taipei; Jin-Chyuan Biar, Taipei Hsien, all of (TW)

(73) Assignee: United Test Center Inc., Hsin Chu (TW)

(*) Notice: Under 35 U.S.C. 154(b), the term of this patent shall be extended for 0 days.

(21) Appl. No.: 09/589,197

(22) Filed: Jun. 8, 2000

(51) Int. Cl.[7] .................................. H01L 21/44
(52) U.S. Cl. .................. 438/107; 438/110; 438/118; 438/121; 438/125
(58) Field of Search ................. 438/107, 110, 438/111, 118, 121–126

(56) References Cited

U.S. PATENT DOCUMENTS

| | | | |
|---|---|---|---|
| 5,731,231 | * | 3/1998 | Miyasima ............... 438/124 |
| 5,811,879 | | 9/1998 | Akram . |
| 5,953,594 | * | 9/1999 | Bhatt et al. ............. 438/125 |
| 6,043,109 | * | 3/2000 | Yang et al. .............. 438/118 |
| 6,060,373 | * | 5/2000 | Saitoh ..................... 438/612 |

* cited by examiner

*Primary Examiner*—Kevin M. Picardat
(74) *Attorney, Agent, or Firm*—Browdy and Neimark

(57) ABSTRACT

A chip scale packaging method is used to package a single-sided substrate and one or more semiconductor chips. The nonconductive surface of the substrate is provided with one or more chip-implanting adhesive areas by stenciling. The adhesive areas are provided with one or more through holes. The chips are implanted in the adhesive areas of the substrate such that the active surface of each chip is in contact with the adhesive area, and that the bonding pads of the active surface of the chip are corresponding in location to the through holes. Upon completion of the chip implantation, the substrate and the implanted chips are heated under pressure before the bonding pads are connected with the conductive surface of the substrate by a plurality of metal bonding wires. The chips and the through holes are subsequently provided with a passivation layer. Finally, the conductive surface of the substrate is implanted with a plurality of spherical bonding points in a grid array fashion.

3 Claims, 4 Drawing Sheets

CHIP SCALE PACKAGING METHOD

FIELD OF THE INVENTION

The present invention relates generally to a semiconductor chip packaging technology, and more particularly to a chip scale packing method.

BACKGROUND OF THE INVENTION

The so-called "chip scale package" is referred to the post-package chip module which is nearly corresponding in size to the semiconductor chip, thereby resulting in the reduction in overall volume of an electronic terminal product made of the chip module.

FIG. 1 shows a sectional schematic view of a conventional semiconductor chip module, which conforms to the requirements of the chip scale package and comprises a double-sided conductive base 10; a semiconductor chip 12 attached to the upper surface of the base 10 by an adhesive layer 14 such that the active surface of the chip faces upward; a plurality of bonding wires 15 connecting a plurality of bonding pads (not shown in the drawing) disposed on the active surface of the chip 12 with the electrical bonding points (not shown in the drawing) which are disposed on the upper surface of the base 10; a plurality of spherical points grid arrays 16 disposed in the underside of the base 10; and a plastic packaging unit 18 for containing hermetically the chip 12 and the bonding wires 15.

Such a conventional semiconductor chip module as described above is defective in design in that the double-sided base 10 must be additionally treated with the costly processes, such as drilling, electroplating, hole-filling, planarizing, etc. In addition, the total useable area of the base 10 is substantially reduced by the holes, which also adversely affect the layout of the printed circuit.

The U.S. Pat. No. 5,811,879 discloses a semiconductor chip module comprising a single-sided conductive base, which is free from the deficiencies of the double-sided conductive base described above. However, the single-sided conductive base is provided in the upper surface with a plurality of recesses in which the chips are secured in place by an adhesive. It is conceivable that the recesses undermine the structural integrity and strength of the single-sided conductive base. In addition, it is time-consuming to provide the chips with an adhesive coating. Moreover, the reliability of the semiconductor chip module is reduced by the interstices which exist between the recess and the chip in the event that the recess and the chip do not match well in size. In other words, such a prior art single-sided conductive base as described above has a high rejection rate.

SUMMARY OF THE INVENTION

It is therefore the primary objective of the present invention to provide a chip scale method for packaging a semiconductor chip module comprising a single-sided conductive base which is cost-effective and is not susceptible to damage in structural integrity as well as weakness in structural strength in the course of the packaging process.

It is another objective of the present invention to provide a chip scale packaging method for assembling a semiconductor chip module which is low in rejection rate.

It is still another objective of the present invention to provide a chip scale packaging method which is relatively more efficient than the prior art methods.

In keeping with the principle of the present invention, the foregoing objectives of the present invention are attained by the chip scale packaging method comprising a first step in which a substrate is provided on one side with a conductive layer, and on other side (nonconductive) with a chip adhering position. The chip adhering position is provided with one or more through holes, and a coating of a thermoplastic adhesive by stenciling. Thereafter, a semiconductor chip is disposed in the chip adhering position such that an active surface of the semiconductor chip is attached to the upper surface of the nonconductive side of the substrate, and that bond pads on the active surface are corresponding in location to the through holes. The substrate and the chip are subsequently heated under pressure for a predetermined period of time so that the chip is securely attached to the substrate. The bond pads of the active surface of the chip are connected by a plurality of bonding wires via the through holes with the bonding points of the substrate. The fringe of the chip and the areas of the through holes are provided with a passivation film of a nonconducting resin material. Finally, the substrate is transformed into a base by implanting the conductive layer of the substrate with a plurality of spherical bond points in a grid array fashion.

It is therefore readily apparent that the base of the semiconductor chip module formed by the method of the present invention is free from the drawbacks of the bases of the conventional semiconductor chip modules of the prior art. In light of the adhesive coating of the present invention being attained by stenciling, the coating process of the method of the present invention is done with efficiency and precision. In addition, the chip is directly implanted on the base, thereby minimizing the likelihood that the structural integrity of the base is undermined.

The foregoing objectives, features, and advantages of the present invention will be more readily understood upon a thoughtful deliberation of the following detailed description of two preferred embodiments of the present invention with reference to the accompanying drawings.

DETAILED DESCRIPTION OF THE INVENTION

Figure 1:
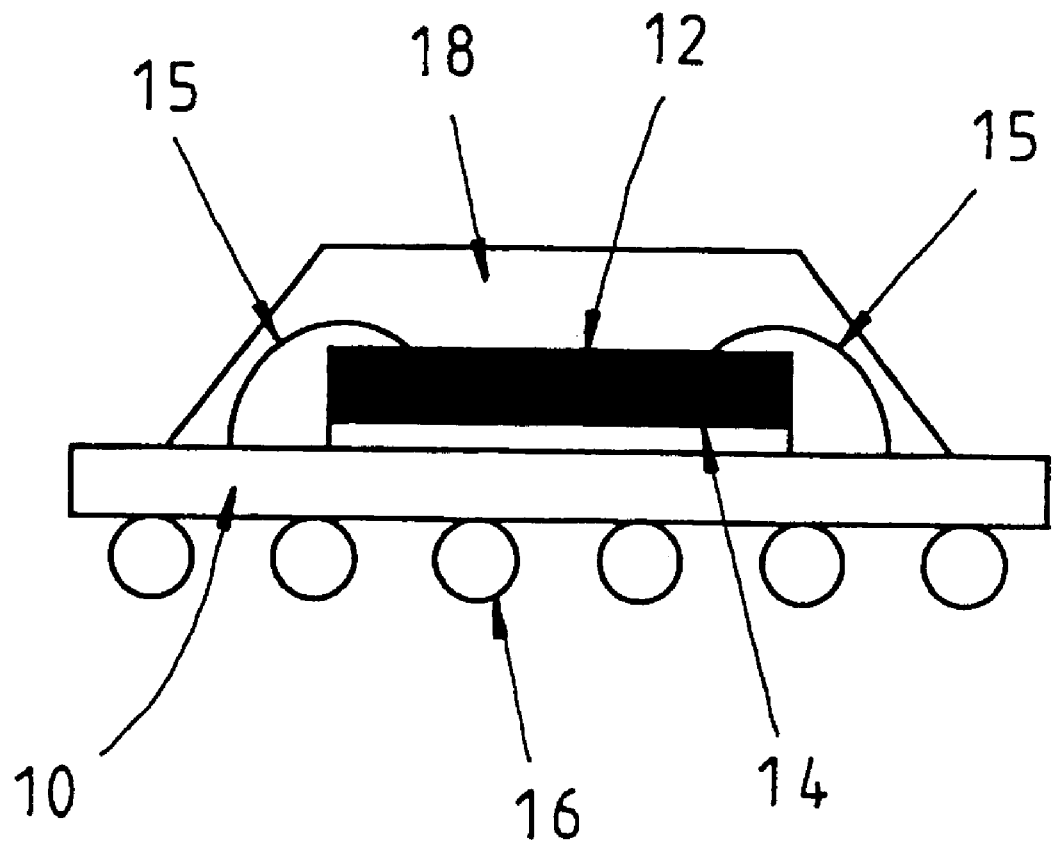
FIG. 1 shows a sectional view of a semiconductor chip module made by a prior art method.
Figure 2:
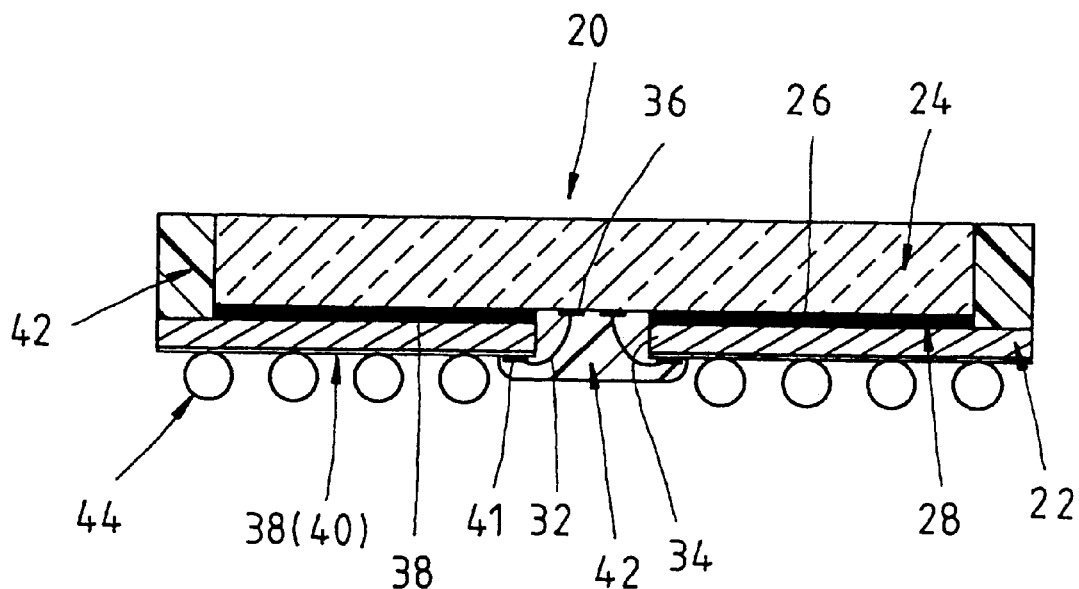
FIG. 2 shows a sectional view of a semiconductor chip module made by a method of a first preferred embodiment of the present invention.
Figure 3:
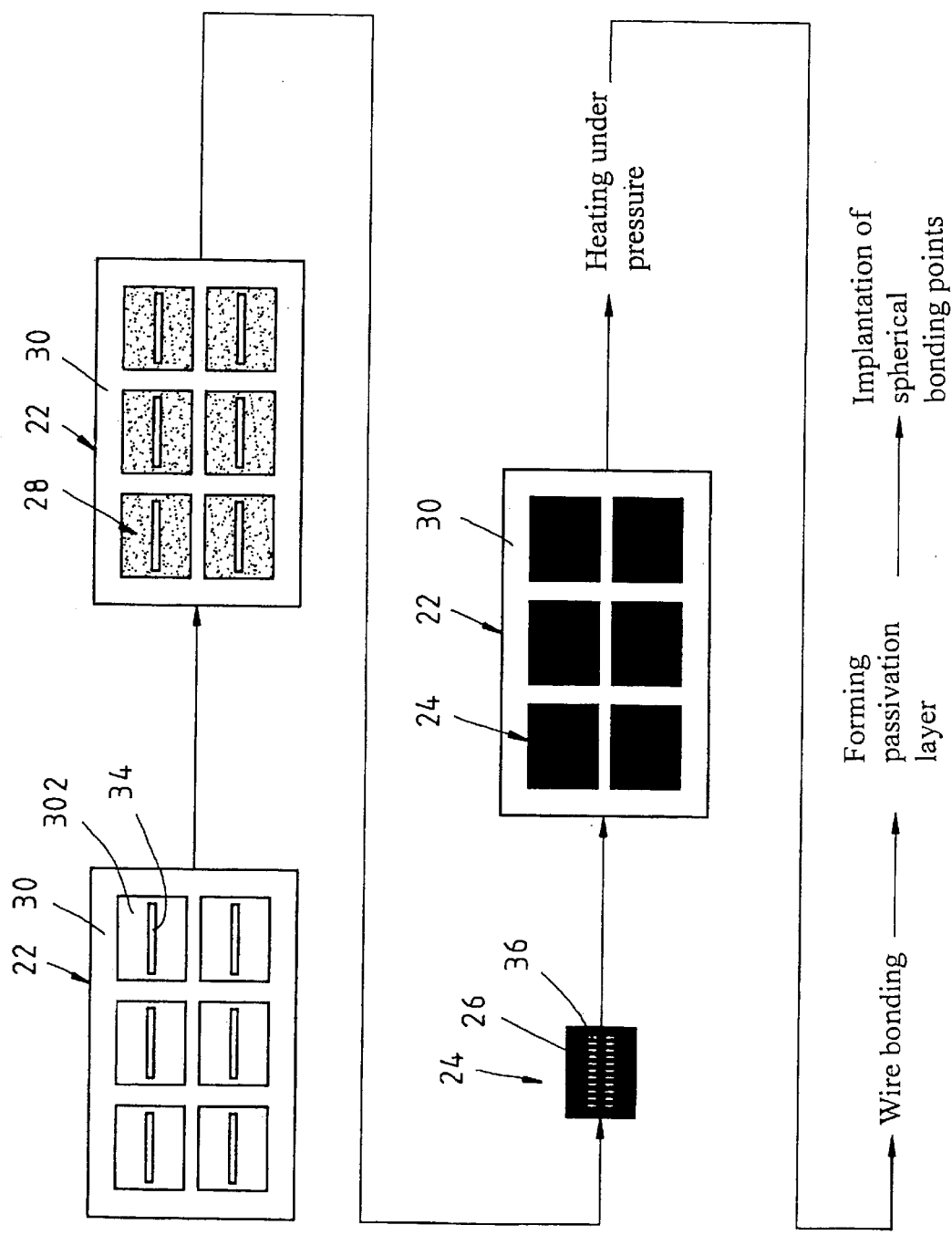
FIG. 3 shows a process flow diagram of the method of the first preferred embodiment of the present invention.

As shown in FIGS. 2 and 3, a semiconductor chip module 20 made by the method of the first preferred embodiment of the present invention comprises mainly a base 22, a semiconductor chip 24, a plurality of metal bonding wires 32, a passivation layer 42, and a plurality of spherical bonding points 44.

The chip 24 has an active surface 26 on which a plurality of bonding pads 36 are disposed. The chip 24 is attached to a nonconductive upper surface 30 of the base 22 by a thermoplastic adhesive layer 28 such that the active surface 26 faces the upper surface 30 of the base 22. The theremoplastic adhesive layer 28 has a thickness ranging between 20–30 microns. The base 22 is provided in two sides thereof with through holes 34 via which the metal bonding wires 32 connect the bonding pads 36 of the active surface 26 of the chip 24 with a conductive area 41 of an underside 38 of the base 22. The conductive area 41 is provided with a conductive layer 40. The underside 38 of the base 22 is provided with the spherical bonding points 44 implanted therein in a grid array fashion. The fringe of the chip 24, each of the through holes 34 of the base 22, and the spherical bonding points 44 are protected by the passivation layer 42 of a nonconducting resin material.

The semiconductor chip module 20 of the present invention is made by a chip scale packaging method of the first preferred embodiment of the present invention, which comprises a first step in which a substrate 22 of an organic polymer is provided with a nonconductive upper surface 30, and a conductive underside 38 having a conductive area 41 with a conductive layer 40. Thereafter, the upper surface 30 of the single-sided substrate 22 is provided with two rows of chip-implanting areas 302, with each having in the center thereof a slender through hole 34. The chip-implanting areas 302 are coated by stenciling with a thermoplastic adhesive layer 28 having a thickness of 25 microns or so. The thermoplastic adhesive is an elastic, semiliquid, solvent-free thermoplastic silicon rubber.

A plurality of semiconductor chips 24 are prepared such that the chips 24 are provided on an active surface 26 thereof with a plurality of bonding pads 36. Each chip 24 is implanted in the area 302 such that the active surface 26 is in contact with the thermoplastic adhesive layer 28, and that the bonding pads 36 are corresponding in location to the through holes 34.

Upon completion of the chip implantation, the substrate 22 and the chips 24 are heated at 190 degrees in Celsius under pressure such that each chip 24 is exerted on by a pressure of 390 grams for about five seconds. As a result, the chips 24 are securely implanted in the areas 302 of the substrate 22.

The substrate 22 and the chips 24 are electrically connected by a plurality of metal bonding wires 32, which connect the bonding pads 36 of the chips 24 with the spherical bonding points 44 of the underside 38 of the substrate 22 via the through holes 34. Upon completion of the wire bonding process, the fringe of each chip 24 and the through hole 34 area are provided with a passivation layer 42 of a nonconducting resin material. Finally, the spherical bonding points 44 of the underside 38 of the base (substrate) 22 are grouped in a grid array fashion.

Figure 4:
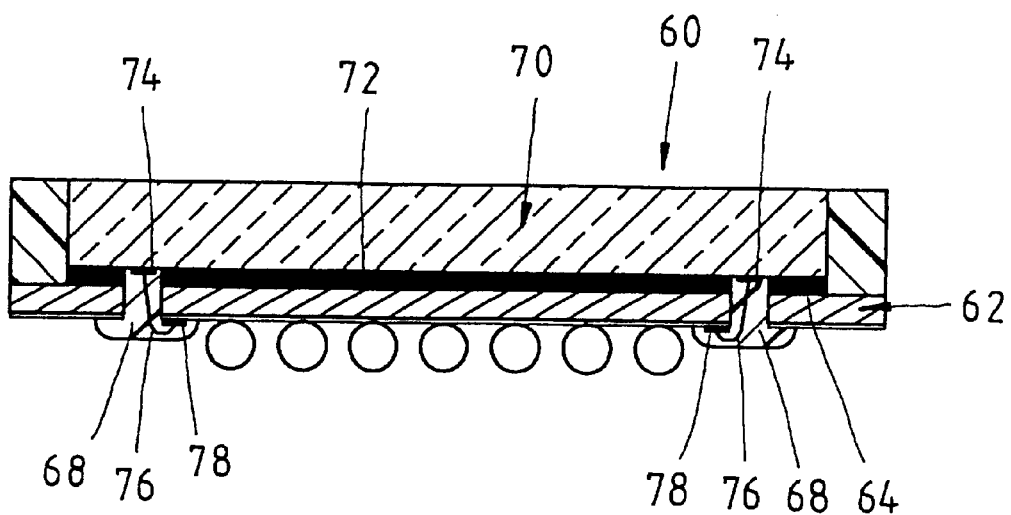
FIG. 4 shows a sectional view of a semiconductor chip module made by a method of a second preferred embodiment of the present invention.
Figure 5:
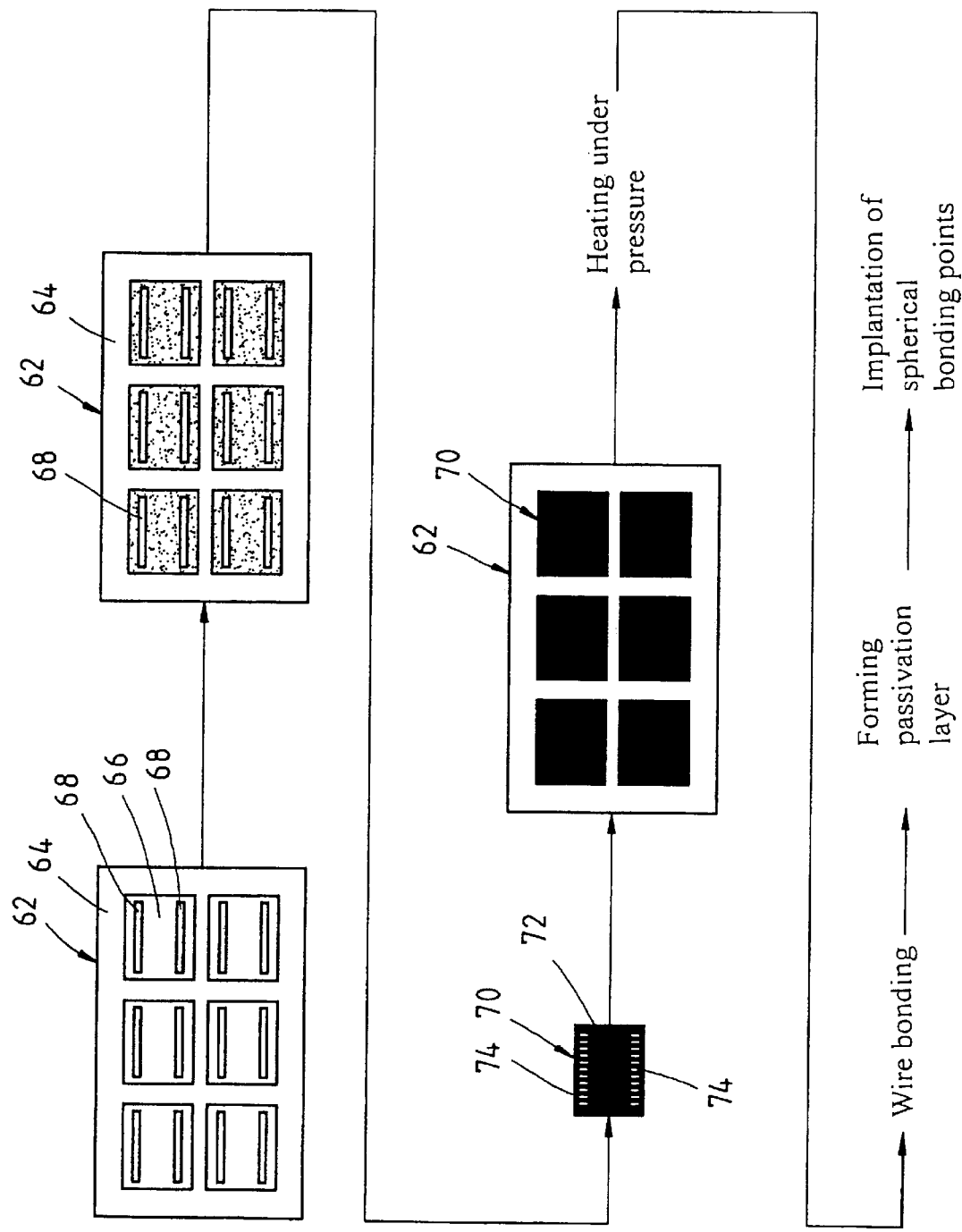
FIG. 5 shows a process flow diagram of the method of the second preferred embodiment of the present invention.

As shown in FIGS. 4 and 5, a semiconductor chip module 60 made by a method of the second preferred embodiment of the present invention is different from the semiconductor chip module 20 of the first preferred embodiment of the present invention in design in that the former comprises a base 62 which is provided in an upper surface 64 with a plurality of chip-implanting areas 66, with each having two through holes 68 parallel to each other. In addition, each chip 70 of the module 60 has an active surface 72 which is provided with a plurality of bonding pads 74 arranged in two opposite sides of the active surface 72. The bonding pads 74 are connected with the bonding points 78 by metal bonding wires 76 via the through holes 68.

It must be noted here that the thermoplastic adhesive layer of the present invention has the thickness ranging between 20 and 30 microns. Such a thickness is most effective in adhesion and in reduction in the junction stress caused by heat expansion.

What is claimed is:

1. A chip scale packaging method comprising the steps of:
   (a) providing a substrate with a conductive surface, and a nonconductive surface which is provided with one or more chip-implanting areas whereby the chip-implanting areas are provided with one or more through holes;
   (b) coating by stenciling the chip-implanting areas with a thermoplastic adhesive layer of a predetermined thickness;
   (c) implanting a semiconductor chip in each of the chip-implanting areas such that an active surface of the chip is in contact with the thermoplastic adhesive layer, and that a plurality of bonding pads of the active surface are corresponding in location to the through holes;
   (d) heating the substrate and the implanted chips at a predetermined temperature and under a predetermined pressure for a predetermined period of time;
   (e) wire bonding the substrate and the implanted chips with a plurality of metal bonding wires whereby the metal bonding wires connect the conductive surface of the substrate with the bonding pads of the implanted chips via the through holes;
   (f) providing the implanted chips and the through holes with a passivation layer of a nonconducting resin material; and
   (g) implanting the conductive surface of the substrate with a plurality of spherical bonding points in a grid array fashion.

2. The method as defined in claim 1, wherein the thermoplastic adhesive is an elastic, semiliquid, solvent-free silicon rubber.

3. The method as defined in claim 1, wherein the thermoplastic adhesive layer has a thickness ranging between 20–30 microns whereby the thickness is most effective in adhesion and in reduction in the junction stress brought about by heat expansion.

* * * * *